United States Patent
Nguyen

(10) Patent No.: US 7,157,953 B1
(45) Date of Patent: Jan. 2, 2007

(54) CIRCUIT FOR AND METHOD OF EMPLOYING A CLOCK SIGNAL

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/104,347

(22) Filed: Apr. 12, 2005

(51) Int. Cl.
*H03K 3/00* (2006.01)

(52) U.S. Cl. ....................... 327/291; 327/299
(58) Field of Classification Search ............... None
See application file for complete search history.

(56) References Cited

U.S. PATENT DOCUMENTS

| | | | | |
|---|---|---|---|---|
| 4,424,703 A | * | 1/1984 | Winter et al. | 73/24.01 |
| 4,538,119 A | * | 8/1985 | Ashida | 331/1 A |
| 5,684,418 A | * | 11/1997 | Yanagiuchi | 327/99 |
| 6,314,155 B1 | * | 11/2001 | Shona et al. | 377/26 |
| 6,701,445 B1 | * | 3/2004 | Majos | 713/500 |

* cited by examiner

*Primary Examiner*—Timothy P. Callahan
*Assistant Examiner*—An T. Luu
(74) *Attorney, Agent, or Firm*—John J. King; Justin Liu

(57) ABSTRACT

The circuits and methods of the present invention relate to circuits for generating a multiplied clock signal based upon a reference clock signal, and circuits using the clock signal to deserialize data. According to one embodiment of the invention, a circuit comprising a counter is coupled to generate a count representative of the period of the input clock signal. A divider circuit coupled to the counter generates a divided count. Finally, a clock generator coupled to the divider circuit outputs an output clock signal having a period which is based upon the divided count. According to other embodiments, circuits and methods disclose receiving serial data using the output clock signal, and outputting the data as parallel data using the reference clock.

17 Claims, 5 Drawing Sheets

CIRCUIT FOR AND METHOD OF EMPLOYING A CLOCK SIGNAL

FIELD OF THE INVENTION

The present invention relates generally to clock signals in integrated circuits, and in particular, to a circuit for and method of generating an output clock signal which is a multiple of an input clock signal.

BACKGROUND OF THE INVENTION

Clock signals are used for a variety of purposes in an integrated circuit device. As the complexity of digital systems increases, clocking schemes continue to become more complicated. While multiple clock generating circuits may be used to generate the multiple clock signals, clock generating circuits typically consume a large amount of chip or board space. Therefore, most systems use one clock generating circuit to generate a first clock signal called a reference clock signal, and a specialized circuit to derive other clock signals from the reference clock signal. For example, clock multipliers are used to generate one or more clock signals of higher clock frequencies from an input or reference clock signal.

An integrated circuit such as a programmable logic device (PLD) typically receives one or more external reference clock signals to generate one or more internal clock signals to operate internal digital circuits. In synchronous systems, global clock signals are used to synchronize various circuits across the integrated circuit or a board using the integrated circuit. For example, internal circuits may be clocked by a first clock signal at a first clock frequency, while input/output (I/O) circuits may be clocked by a second clock signal at a second clock frequency, where the second clock frequency may be a multiple of the first clock frequency.

Conventional clock management circuits are used in integrated circuits to perform frequency multiplication. For example, frequency multiplication is accomplished using a Phase-Locked Loop (PLL) circuit that controls the phase and frequency by adjusting an analog voltage. However, there are a number of disadvantages in using a PLL for clock multiplication. For example, analog circuits for adjusting the voltage are sensitive to the power supply and operating temperatures. PLLs are generally difficult to design, and difficult to migrate to new integrated circuit processes and power supply reductions. Finally, PLLs often have low yields, and may require external resistors and capacitors, creating an additional burden on a user of the PLL.

Similarly, delay-locked loops (DLLs) are also used as clock multipliers, and manage the propagation delay of the clock signals by using a delay line. If the delay line in the oscillator is voltage-controlled, sensitive analog circuits are also used to adjust the frequency by adjusting the voltage applied to the delay line (i.e., voltage controlled delay elements). Further, DLLs comprise a linear chain of delay elements and binary multiplexers for clock selection. Therefore, DLLs generally occupy a significant area and have large intrinsic delay. Complicated state machines are also necessary to provide the selected delay. Finally, DLLs are typically slow to lock.

Accordingly, there is a need for a circuit for and method of generating a multiplied clock signal in an integrated circuit.

SUMMARY OF THE INVENTION

The circuits and methods of the present invention relate to circuits for generating a multiplied clock signal based upon a reference clock signal, and circuits for using the clock signals to deserialize data. According to one embodiment of the invention, a circuit comprising a counter is coupled to receive an input clock signal and generate a count representative of the period of the input clock signal. A divider circuit coupled to the counter generates a divided count. Finally, a clock generator coupled to the divider circuit outputs an output clock signal having a period which is based upon the divided count. According to another embodiment, the circuit is coupled to receive serial data using the output clock signal, and output the data as parallel data using the input clock. Specific embodiments for processing video signals are also disclosed.

According to an alternate embodiment, a method of employing a clock signal in an integrated circuit is disclosed. The method comprises steps of receiving a first clock signal; determining the period of the first clock signal; dividing the period of the first clock signal to generate a divided clock period; using the divided clock period to generate a second clock signal; receiving data using the second clock signal; and outputting the data using the first clock signal. Specific embodiments of the method related to deserializing data are also disclosed.

DETAILED DESCRIPTION OF THE DRAWINGS

Figure 1:
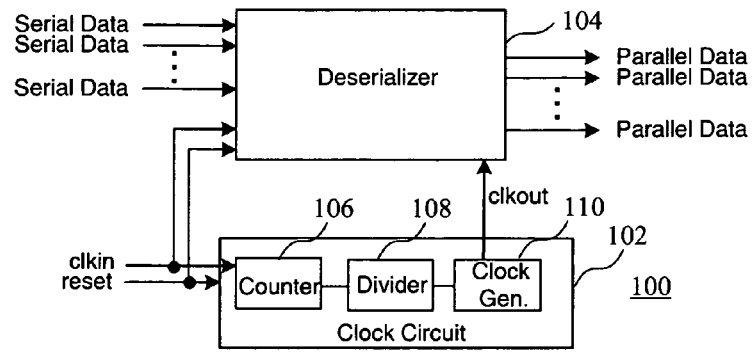
FIG. 1 is a block diagram of a circuit for employing a clock signal according to an embodiment of the present invention.

Turning first to FIG. 1, a block diagram of a circuit for employing a clock signal according to an embodiment of the present invention is shown. In particular, a clock circuit 102 receives an input clock (clkin) signal and generates an output clock (clkout) signal. As will be described in more detail below, the output clock is preferably a multiple of the input clock, and may be used to receive serial data at a higher rate than the input clock at a deserializer 104, which outputs parallel data using the input clock. The clock circuit 102 comprises a counter 106, a divider circuit 108, and a clock generator 110. The counter 106 couples a count based upon the period of the input clock signal to the divider circuit 108. The divider circuit 108 may be any conventional divider circuit for generating a divided count based upon an input count. The divided count is then used by the clock generator to generate an output clock signal based upon the divided count. Both the clock circuit 102 and the deserializer 104 may also receive a reset signal. In certain applications described in more detail below, multiple streams of input serial data are output as parallel data.

Figure 2:
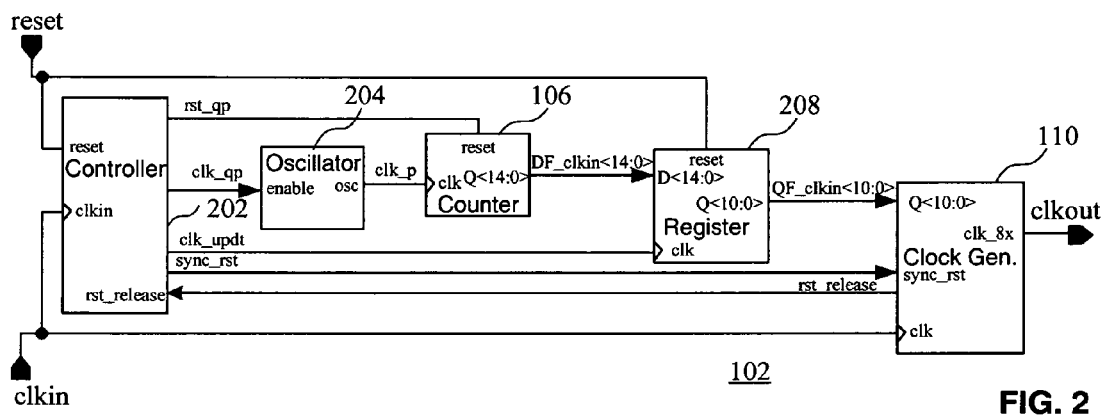
FIG. 2 is a block diagram of a clock circuit for generating a clock signal according to an embodiment of the present invention.

A block diagram of the clock circuit 102 is shown in more detail in FIG. 2. In particular, the clock circuit 102 comprises a controller 202 coupled to receive the input clock, and generates various control signals for the other elements of the circuit. The controller 202 generates an oscillator enable signal (clk_qp) coupled to an oscillator 204. The oscillator may be any type of oscillator having an enable signal, including for example a CMOS ring oscillator. The oscillator 204 generates an oscillator output signal (clk_p) which is coupled to a counter 106. The counter 106 is reset by a counter reset signal (rst_qp). According to one embodiment of the invention, the counter outputs a count value, such as a binary count value DF_clkin<14:0>, representative of the period of the input clock signal. In the circuit of FIG. 2, the divider circuit comprises a register. That is, register 208 enables a divider circuit by generating a registered binary value representing the count value output by the counter. Register 208 may be a shift register for generating a divided clock period signal. For instance, register 208 may right shift the binary count value DF_clkin<14:0> to provide a divided registered count value QF_clkin<10:0> of the binary count value. The divided count value may then be provided to the clock generator 110. Alternatively, only the required bits of register 208 representing the divided count (i.e. only the greatest 11 bits in this example) may be coupled to the clock generator 110. According to another embodiment, an element of the clock generator itself may do the shifting or the selection of required bits to generate a divided count. Other circuits may also be used to divide the count value. As will be described in more detail below in reference to FIG. 3, a clock update signal (clk_updt) is generated to periodically update the count value stored by register 208. Finally, as will also be described in detail below in reference to FIGS. 3 and 4, various reset signals are coupled to the counter 106, the register 208 and the clock generator 110 in order to generate the correct output clock signal.

Figure 3:
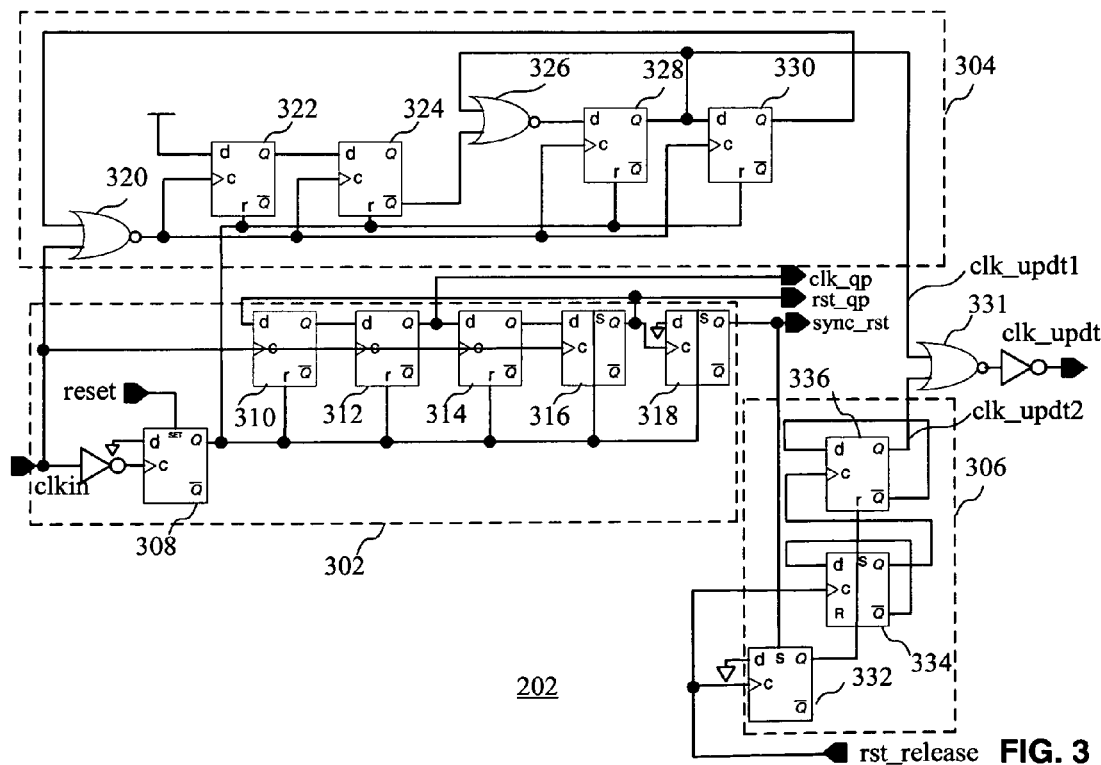
FIG. 3 is a block diagram of a controller circuit of FIG. 2 according to an embodiment of the present invention.

Turning now to FIG. 3, a block diagram of a controller circuit of the clock circuit of FIG. 2 is shown. The controller circuit 202 generally comprises a counter control circuit 302 which generates the oscillator enable signal (clk_qp), the counter reset signal (rst_qp), and a sync reset (sync_rst) signal. The controller circuit 202 also comprises a pair of clock update signal generators. A first clock update generator 304 generates an initial clock update signal (clk_updt1) which is used at startup before a reset release signal is generated by the clock generator 110. After a reset release (rst_release) signal is generated, which will be described in more detail in reference to FIGS. 5 and 6, a second clock update generator 306 outputs a second clock update signal (clk_updt2). The circuit configuration and operation of each of the individual circuits 302, 304 and 306 will be described individually in reference to the timing diagram of FIG. 4 and the overall clock circuit 102 of FIG. 2.

The counter control circuit 302 comprises a register 308 which is clocked with the inverted input clock and has its data input tied to ground. The output of register 308 is coupled to the reset terminals of registers 310, 312, and 314, and the set terminals of registers 316 and 318. The output of the registers 310–314 are coupled to the inputs of registers 312–316, respectively. Registers 310–316 are clocked using the input clock, while register 318 is clocked using the output of register 316. Finally, the output of register 316 is fed back to the input of register 310. The oscillator enable signal (clk_qp) is generated at the output of register 312, and the counter reset signal (rst_qp) is generated at the output of the register 316. Finally, the register 318 outputs the sync_reset signal (sync_rst) which is coupled to reset the clock generator 110.

In operation, register 308 of the counter control circuit 302 receives a reset signal at a set terminal. After register 308 is set by a high reset signal at a time $t_0$, registers 310–314 will be reset. After reset goes low at a time $t_1$, the output of register 308 remains high (resetting registers 310–314 and setting register 316) at $t_2$ because register 308 only changes states on the falling edge of the clkin signal (and therefore the rising edge of the inverted clkin signal). The inverted clkin signal will then go high at a time $t_3$ to make the output of register 308 go low (releasing registers 310–314 and 316 from reset and set, respectively). At a time $t_4$, the oscillator enable signal clk_qp goes high for a clock period, enabling the oscillator 204 to generate a signal clk_p coupled to the counter 106. As can be seen, a count DF_clkin <14:0> is generated by the counter during a full period after $t_4$ while the oscillator is enabled. Accordingly, the counter generates a count representative of the period of the clkin signal. The value of the count is then registered by register 208 in response to a high clk_updt signal coupled to the register 208 at a time $t_5$. In the example shown in the timing diagram of FIG. 4, the value of the count is 308.

The generation of the clock update signal will now be described. During startup, a clk_updt1 signal generated by the first clock update generator 304 is used to generate a clk_updt signal before a reset release signal is generated by the clock generator 110. The reset release signal is then used to generate a clk_updt2 signal (and therefore the clk_updt signal), as will be described below in reference to the second clock update generator 306. The first clock update generator 304 receives the clkin signal at a first terminal of a NOR gate 320, the output of which is coupled to clock registers 322–330, each of which is reset by the output of register 308. The output of register 322 is coupled to the input of register 324. The inverted output of register 324 is coupled to an input of a NOR gate 326, the output of which is coupled to the input of register 328. The output of register 328 (i.e., clk_updt1) is coupled to the input of register 330 and an input of a NOR gate 331. Clk_updt1 is also fed back to an input terminal of NOR gate 326. Finally, the output of register 330 is fed back to an input terminal of NOR gate 320.

In operation, when the output of register 308 goes high in response to the reset signal applied to the set terminal, registers 322 and 324 are reset, generating a high signal at the inverted output of register 324. That is, a high output is generated at the non-inverted output of register 324 after two clock periods after clk_in goes low at time $t_3$. The inverted output of register 324 which goes low generates a high out at the output of NOR gate 326. Therefore, at a time $t_5$, the output of register 328 goes from low to high to generate a high clk_updt1 and therefore a high clk_updt signal. A high output of register 330 is then fed back to NOR gate 320 to generate a low output at its output to eliminate the first clock update generator 304 from the circuit after clk_updt1 is generated. As will be described in more detail in reference to FIG. 5, the reset release signal is generated at a time $t_6$, enabling a clkout signal to be generated at a time $t_7$. As can be seen at a time $t_8$, the clk_qp signal again goes high based upon the operation of the counter control circuit 302, enabling the period of the clkin signal to be updated.

The second clock update generator 306 comprises a register 332 which is clocked by the reset release signal and the output of which is coupled to set a register 334 and reset a register 336. In particular, the register 334 is clocked by the reset release signal, and the input of register 334 is coupled to receive its inverted output. The output of register 334 is coupled to the clock input of register 336. The inverted output of register 336 is coupled to its input, and the output is coupled to an input of NOR gate 331. After the circuit has been running and a reset release signal is generated by the clock generator 110, the second clock update generator 306 causes the clk_updt signal to go high four clock cycles later at a time t9. Finally, as can be seen at times $t_{10}$ and $t_{11}$, the clk_updt is only high after the last pulse of clkout and before the next rising edge of clkin.

Figure 5:
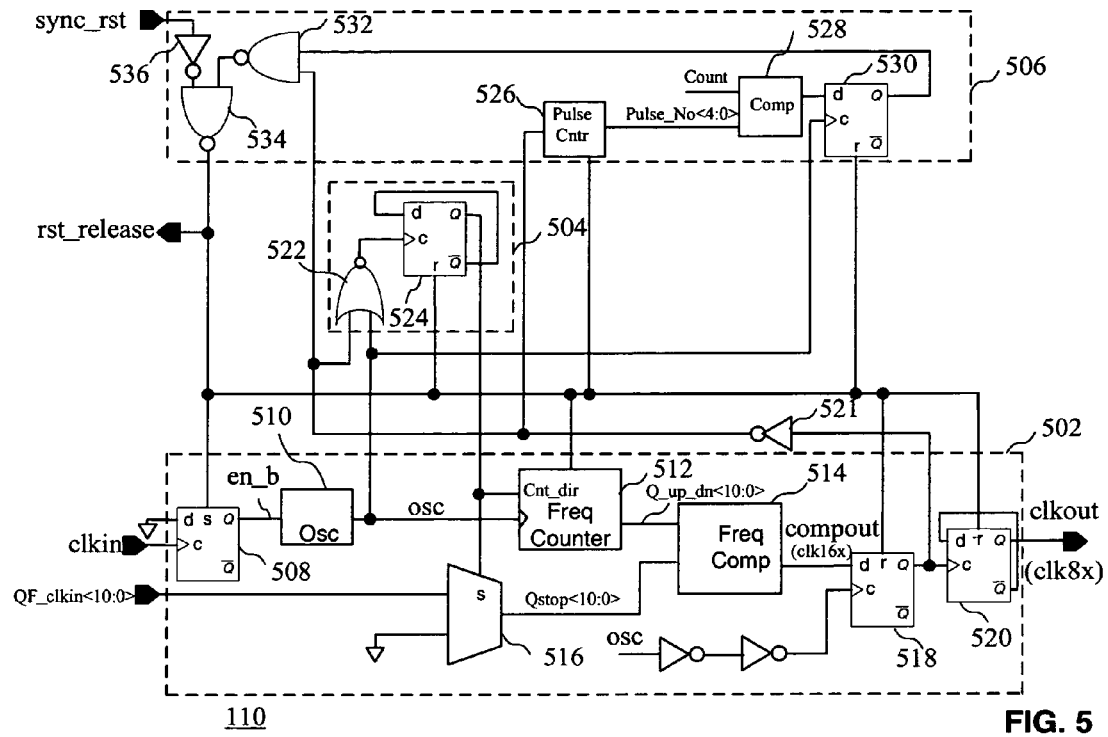
FIG. 5 is a block diagram of a clock generator of FIG. 2 according to an embodiment of the present invention.

Turning now to FIG. 5, a block diagram of a clock generator according to an embodiment of the present invention is shown. In particular, the clock generator 110 comprises a clock output circuit 502 coupled to receive the input clock signal, and generate an output clock which is a multiple of the input clock. According to one embodiment of the invention which employs an up-down frequency counter, a direction change circuit 504 will change the direction of the frequency counter in response to an intermediate output of the clock output circuit 502. Also, the intermediate output of the clock output circuit is used by a reset circuit 506 to generate the reset release signal (rst_release), as described above with respect to FIG. 3. Finally, the circuit of FIG. 5 is described by way of example as generating an output clock which is eight times faster than the input clock. While the example is provided to help in understanding the operation of the circuit, it should be understood that the various inputs may be selected to generate a desired output clock having frequency which some other multiple of the input clock.

Figure 6:
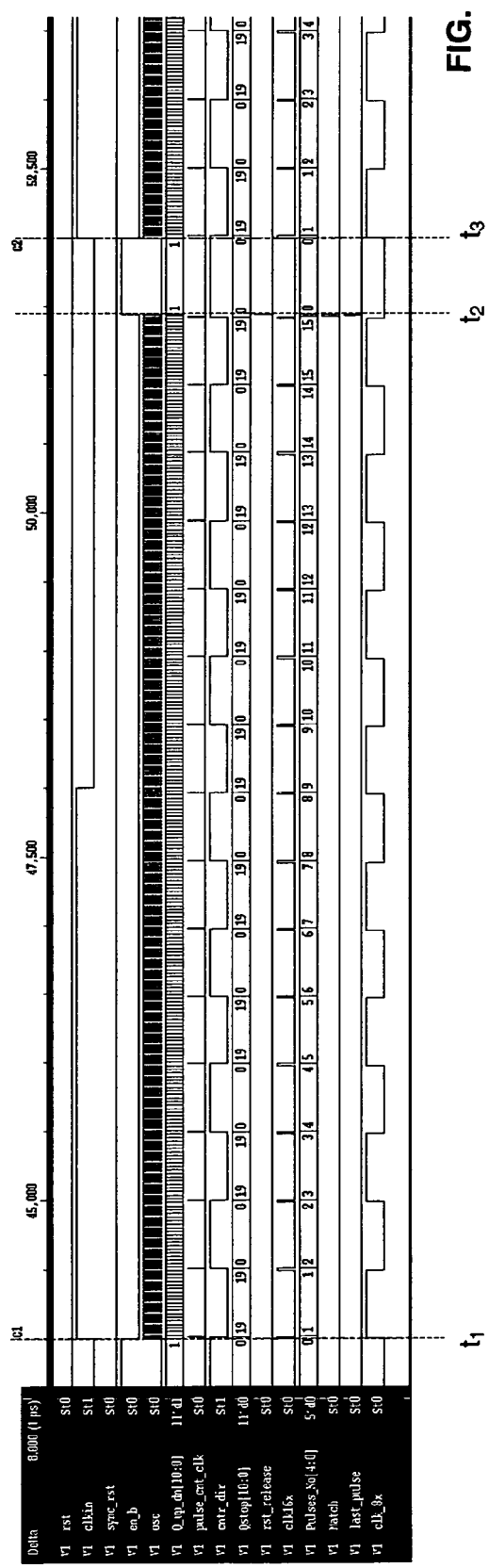
FIG. 6 is a timing diagram showing the operation of the clock generator of FIG. 5.

The clock output circuit 502 is clocked by the clkin signal coupled to a register 508 which generates an enable signal (en_b) for an oscillator 510. As can be seen in FIG. 6, the en_b signal goes low at time t1 after clkin goes high, and resets the oscillator at a time t2 in response to the reset release signal before enabling the oscillator again in response to the clkin signal. The output of oscillator 510 is coupled to a frequency counter 512 which generates a count. The count may be, for example, a binary count Q_up_dn<10:0>. The count generated by a frequency counter 512 is compared to a divided period based upon the period stored in register 208. In particular, the frequency comparator 514 may compare a count output by frequency counter 512 with the divided count value representing a divided period of the input clock. For example, a divided count value may be a right shifted binary value representing a predetermined fraction of the period of the input clock (e.g., ½, ¼, ⅛, etc.). In the example shown in FIG. 5, the count value from counter 106 is right shifted 4 bits to provide a divided count value that is 1/16 the period of the input clock. When the value output by the frequency counter 512 equals the divided count value, the output of the frequency comparator will generate a high signal. As the counter continues to count, the value output by the frequency counter no longer equals to the divided count value, and the frequency comparator will generate a low signal. That is, the frequency counter will generate a pulse when the output of the frequency counter equals the divided count value. Accordingly, the output (compout) of the frequency comparator will have a period which is some predetermined fraction of the period of the input signal clkin.

The predetermined fraction of the input clock period is chosen so that the output of the clock output circuit 502 comprises a signal having the desired frequency with a fifty percent duty cycle. In particular, if a clock signal which is eight times as fast as the input clock signal is desired, an output pulse train (compout) is selected to be a frequency of sixteen times the input clock frequency. That is, the output of the frequency comparator is coupled to the input of the register 518, which clocks the register 520 to generate a fifty percent duty cycle clock. Register 518 is clocked by a delayed version of the osc signal. The delayed version may be generated by a non-inverting buffer, two inverters, a CMOS pass gate, a long wire, etc. A reset terminal of register 518 is coupled to the reset release signal. The function of register 518 is for filtering glitches at the frequency comparator by sampling the frequency comparator output after the momentary glitches settle down. Therefore, the delayed version of the osc signal must be sufficient for the glitches to settle down. Accordingly, if the output of the frequency comparator has a frequency of sixteen times the frequency of the input clock, the output of the register 520 will have a clock frequency of eight times the input clock.

According to another aspect of the invention, the frequency counter 512 is implemented as an up-down counter. The output of the frequency counter is compared to the output of a multiplexer which receives the divided clock period. For example, a shifted binary value of the period of the input clock signal is provided at one input and all zeros at the other input. Both the frequency counter 512 and the multiplexer 516 are controlled by an output of the count direction circuit 504, where the output of the count direction circuit changes the direction of the frequency counter 512 and selects the output of the multiplexer 516. That is, the output of the multiplexer 516 (Qstop<10:0>) is either a divided value of the clock period or all zeros. Therefore, when counting up, the frequency counter will count from zero, and the frequency comparator will output a pulse when the output of the frequency counter (Q_up_dn<10:0>) equals the divided count value (QF_clkin<10:0>). After a pulse is generated by the frequency comparator, the output of the register 518, inverted by an inverter 521, is coupled to an input of a NOR gate 522, which clocks register 524 to change the count direction (cnt_dir) signal coupled to a count direction input of the frequency counter 512 and the control input of the multiplexer 516. Similarly, when counting down, the frequency counter will count from Q_up_dn<10:0>, and the frequency comparator will output a pulse when the output of the frequency counter equals zero.

Figure 4:
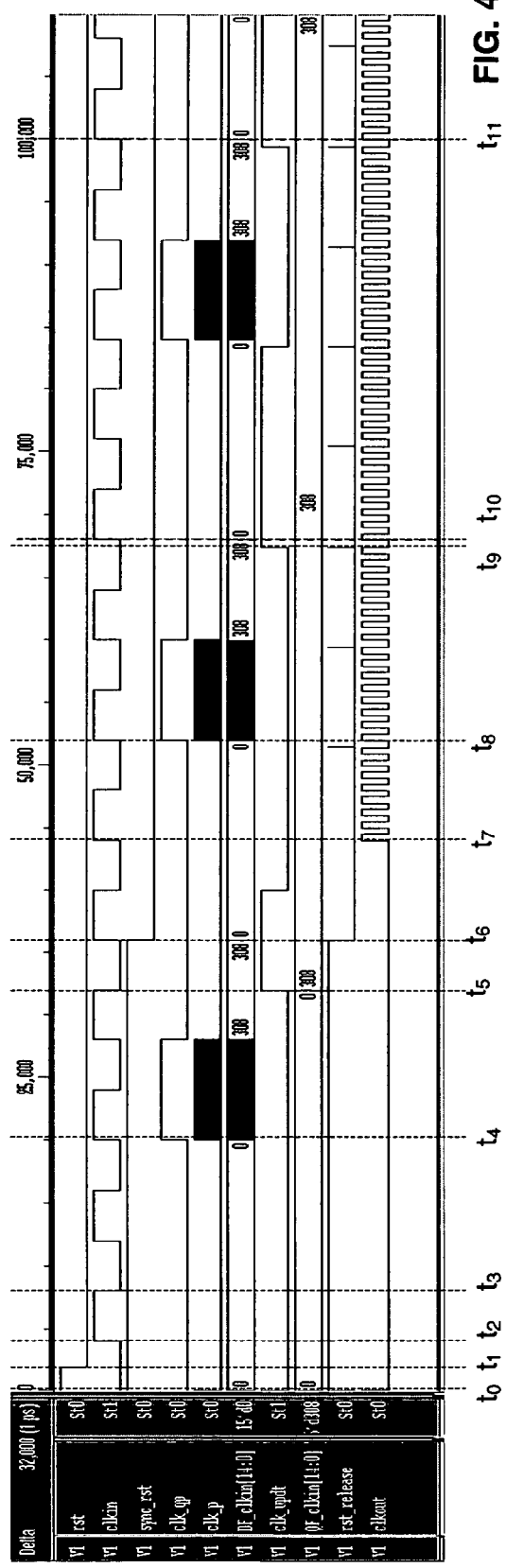
FIG. 4 is a timing diagram showing the operation of the clock circuit of FIG. 2.

Finally, the reset circuit 506 generates the reset release signal which is also generated based upon the output of the register 518. In particular, the output of the register, after being inverted by inverter 521, is coupled to a pulse counter 526 which generates a pulse count (pulse_no<4:0>). The pulse count is compared to a desired count value (Count) by a comparator 528. For example, when generating an output of the frequency comparator 514 as a signal having a frequency which is sixteen times the frequency of the input signal (necessary to generate a signal having a frequency which is eight times the input frequency at the output of the clock output circuit 502), the Count value is set at a binary value of 16 (i.e., 0b10000). When the pulse_no<4:0> equals the Count value, the output of register 530 goes high. The output of register 530 is coupled to an NAND gate 532 which is also coupled to receive the inverted output of the register 518. The output of NAND gate 532 is coupled to a NAND gate 534, which also receives an inverted sync reset (sync_rst) signal. As shown in FIGS. 3 and 4, when the sync_rst signal goes low at time t6, the input to NAND gate 534 stays high. Also, the inverted output of register 518 will be high after a pulse is generated by the frequency comparator 514. Accordingly, the reset release signal will go high after the count of the output pulses generated by the pulse counter 526 equals the desired Count value (and a high signal is therefore generated at the output of the register 530). As described above, the reset release signal is used by the controller to generate the clock update signal.

Figure 7:
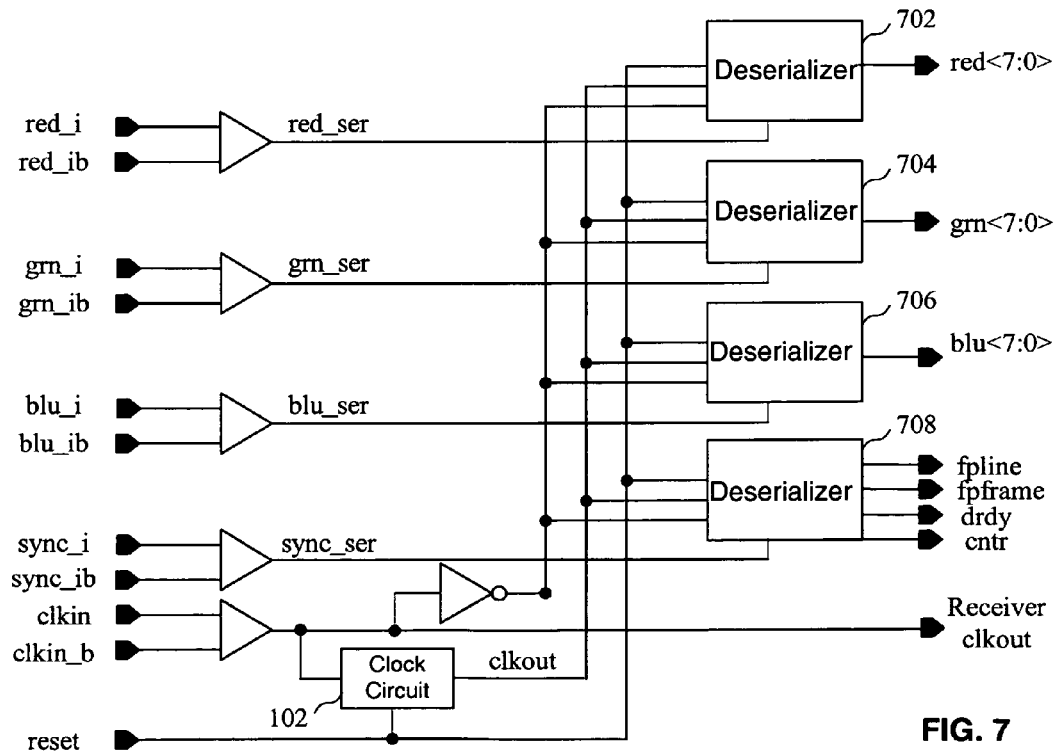
FIG. 7 is a block diagram of a video processing circuit employing the clock circuit of FIG. 2 according to an embodiment of the present invention.
Figure 8:
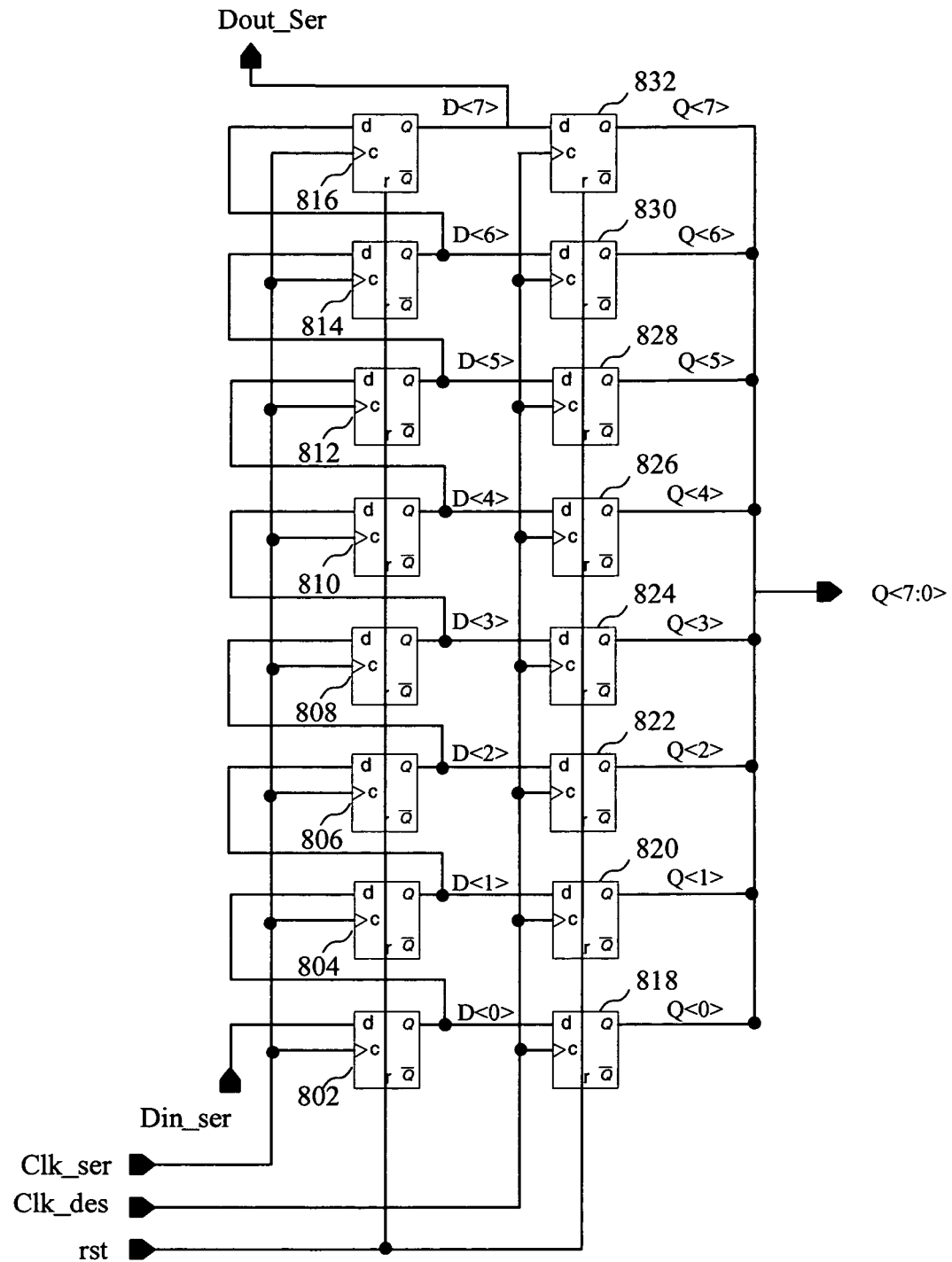
FIG. 8 is a block diagram of a deserializer according to an embodiment of the present invention.

Turning now to FIG. 7, a block diagram of a circuit employing the clock circuit of FIG. 2 according to an embodiment of the present invention is shown. In particular, deserializers 702–708 are each coupled to receive a stream of input serial data using the serial clock (clkout), which may be, for example an 8× clock generated by a clock circuit 102, and output parallel data using the input clock signal clkin. According to one embodiment, a video processing circuit may receive serial data representing red, green and blue serial video data, and output corresponding red<7:0>, green<7:0>, and blue<7:0> data from deserializer circuits 702–706, respectively, as well as control signals from deserializer 708. A block diagram of a deserializer employed according to an embodiment of the present invention is shown in FIG. 8. In particular, an input circuit comprising a plurality of registers 802–816 are coupled in series and are clocked using the serial clock (clk_ser), which may be for example the 8× clock. The outputs of the registers 802–816 are coupled to the inputs of a corresponding output circuit comprising a plurality of registers 818–832, the outputs of which generate the bits of the parallel output data. The registers 818–832 are clocked using the deserializer clock, which may be the inverted input clock.

Figure 9:
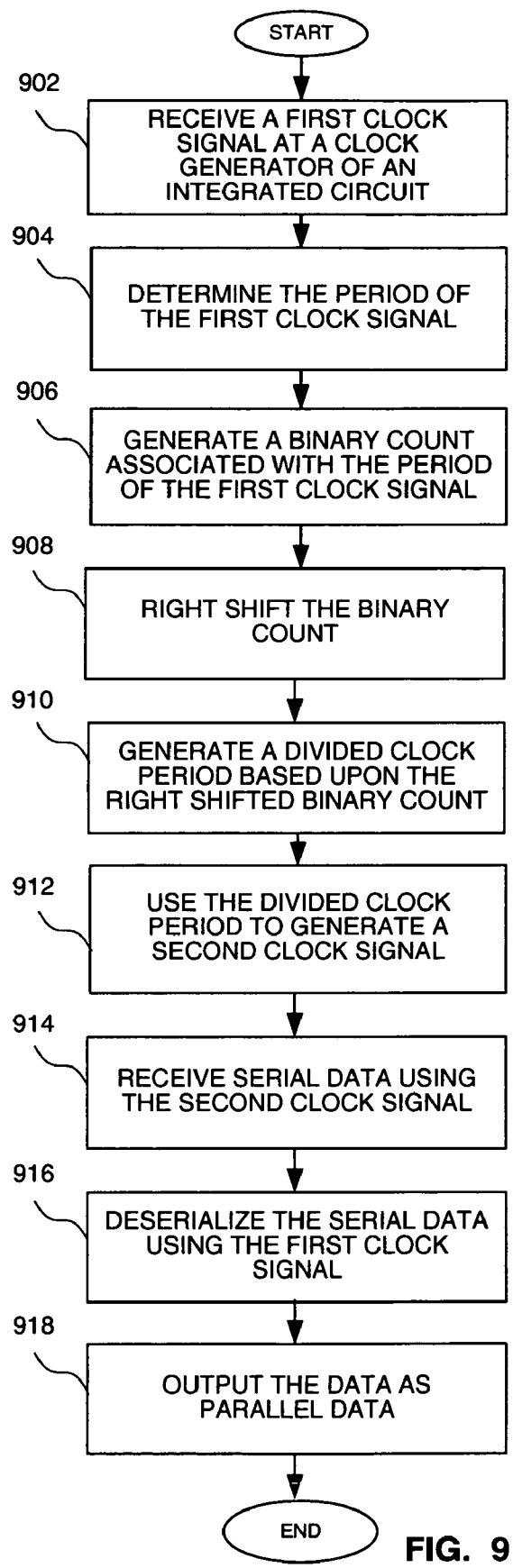
FIG. 9 is a flow chart showing a method of employing a clock signal according to an embodiment of the present invention.

Finally, a flow chart in FIG. 9 shows a method of employing a clock signal according to an embodiment of the present invention. The method of FIG. 9 may be implemented using the circuit of FIGS. 1–8, or other suitable circuits. A first clock signal is received at a clock generator of an integrated circuit at a step 902. The period of the first clock signal is determined at a step 904. A count associated with the period of the first clock signal is generated at a step 906. The count may be, for example, a binary count. The count is then divided by a known value at a step 908. For example, where a binary count is used, the count is right shifted to generate a known divided count. A divided clock period based upon the divided count is generated at a step 910. The divided clock period is used to generate a second clock signal at a step 912. Serial data is received using the second clock signal at a step 914. The serial data is deserialized using the first clock signal at a step 916. Finally, the data is output as parallel data at a step 918. Although a single stream of serial data being converted is described, multiple data streams may be converted simultaneously to parallel data according to the method of FIG. 9.

It can therefore be appreciated that the new and novel method of and circuit for employing a clock signal has been described. It will be appreciated by those skilled in the art that numerous alternatives and equivalents will be seen to exist which incorporate the disclosed invention. As a result, the invention is not to be limited by the foregoing embodiments, but only by the following claims.

REFERENCE TO A COMPUTER PROGRAM LISTING APPENDIX

This application includes a computer program-listing appendix on a single compact disc, the contents of which are incorporated herein by reference in their entirety. The compact disc contains an 8 KB file entitled "SERDES_1to8.v" created on Apr. 8, 2005.

The appendix provided contains a hardware description language (Verilog code) description for implementing the circuits of FIGS. 3 and 5. The code provided in this appendix contains material subject to copyright protection. The copyright owner of that material has no objection to the facsimile reproduction of the patent document or the patent disclosure, as it appears in the Patent and Trademark Office patent files or records, but otherwise reserves all copyright rights whatsoever.

I claim:

1. A circuit for employing a clock signal in an integrated circuit, said circuit comprising:
   a counter generating a count representative of the period of an input clock signal;
   a divider circuit coupled to said counter, said divider circuit generating a divided count based upon said count representative of the period of said input clock signal;
   a clock generator coupled to said divider circuit, said clock generator outputting an output clock signal having a period which is based upon said divided count;
   a controller coupled to receive said input clock signal and generate a signal to update said count.

2. The circuit of claim 1 wherein said counter comprises a binary counter generating a binary count representative of said period of said input clock signal.

3. The circuit of claim 2 wherein said divider circuit comprises a register.

4. The circuit of claim 2 wherein said clock generator comprises a frequency counter generating a binary count.

5. The circuit of claim 4 wherein said frequency counter comprises an up-down counter which reverses a count direction when the output of said frequency counter is equal to said divided count generated by said divider circuit.

6. The circuit of claim 5 further comprising a comparator having a first input receiving an output of said up-down counter.

7. The circuit of claim 6 further comprising a multiplexer coupled to receive said divided count, wherein the output of said multiplexer is coupled to a second input of said comparator.

8. The circuit of claim 7 further comprising a register coupled to the output of said comparator, wherein said clock signal output by said register comprises a fifty percent duty cycle clock signal.

9. The circuit of claim 1 further comprising an input circuit coupled to receive serial input data using said output clock signal, and an output circuit coupled to said input circuit, said output circuit outputting parallel data based upon said serial input data using said input clock signal.

10. A circuit for employing a clock signal in an integrated circuit, said circuit comprising:
    means for generating a count representative of a period of an input clock signal;
    means for generating a divided count based upon said count representative of the period of the input clock signal;
    means for generating an output clock signal having a period which is based upon said divided count; and means for receiving serial data using said output clock signal and outputting parallel data using said input clock signal.

11. The circuit of claim 10 further comprising means for updating said count representative of the period of the input clock signal.

12. The circuit of claim 10 further comprising means for generating a signal representing the period of said input clock signal.

13. The circuit of claim 10 wherein said means for receiving serial data comprises means for receiving a plurality of serial data streams using said output clock signal and outputting a plurality of parallel data streams using said input clock signal.

14. A method of employing a clock signal in an integrated circuit, said method comprising the steps of:
  receiving a first clock signal;
  using a counter to determine the period of said first clock signal;
  dividing said period of said first clock signal to generate a divided clock period;
  using said divided clock period to generate a second clock signal;
  receiving data using said second clock signal; and
  outputting said data using said first clock signal;
  wherein said step of receiving data using said second clock signal comprises a step of receiving serial data.

15. The method of claim 14 wherein said step of using a counter to determine the period of said first clock signal comprises a step of generating a binary count.

16. The method of claim 15 wherein said step of dividing said period of said first clock signal to generate a divided clock signal comprises a step of right shifting said binary count.

17. The method of claim 14 wherein said step of outputting said data using said first clock signal comprises a step of outputting parallel data.

* * * * *